United States Patent
Ames et al.

(10) Patent No.: US 6,528,777 B2
(45) Date of Patent: Mar. 4, 2003

(54) OPTICAL POWER METER DERIVED FROM COMMON-MODE VOLTAGE OF OPTICAL TRANSIMPEDANCE AMPLIFIER

(75) Inventors: Stephen J. Ames, Rochester, MN (US); Steven John Baumgartner, Rochester, MN (US); Kenneth Paul Jackson, Rochester, MN (US); Clint Lee Schow, Rochester, MN (US); Michael A. Sorna, Hopewell Junction, NY (US); Steven John Zier, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 95 days.

(21) Appl. No.: 09/761,526

(22) Filed: Jan. 16, 2001

(65) Prior Publication Data

US 2002/0092972 A1 Jul. 18, 2002

(51) Int. Cl.[7] .............................................. H01J 40/14
(52) U.S. Cl. ............................. 250/214 R; 250/214 A
(58) Field of Search ..................... 250/214 R, 214 A, 250/214.1, 214 LA; 356/221–226; 359/152, 154, 189; 330/308, 59

(56) References Cited

U.S. PATENT DOCUMENTS 6,084,232 A * 7/2000 Kimura ................. 250/214 A

* cited by examiner

*Primary Examiner*—Que T. Le
(74) *Attorney, Agent, or Firm*—Karuna Ojanen (57) ABSTRACT

An optical transceiver with a transimpedance amplifier generates a dynamic common mode voltage of the peak-to-peak output current of the photodetector for use as an in-situ optical power meter. Peak-to-peak voltage signal are imposed on the common mode voltage so optical power measurements are obtained using preexisting electrical contacts. An nfet and a capacitor of the transimpedance amplifier smooths the peak-to-peak voltage to create the control signal for the common mode voltage. The common mode current is mirrored into a bank of pfets at the output stage to create a current sink. Depending upon the potential of the common mode voltage, more or less current will be drawn from the peak-to-peak voltage signals output from a final differential amplifier stage of the transimpedance amplifier.

19 Claims, 6 Drawing Sheets

OPTICAL POWER METER DERIVED FROM COMMON-MODE VOLTAGE OF OPTICAL TRANSIMPEDANCE AMPLIFIER

FIELD OF THE INVENTION

This invention relates generally to the field of optical data transmission and more specifically relates to measuring the peak-to-peak optical power incident on a photodetector connected to a transimpedance amplifier having an in situ optical power meter function.

BACKGROUND OF THE INVENTION

Increasingly so, today's communications uses optical data transmitted through, for instance, a fiber optic cable. At the receiving end of a fiber optic link, a photodetector receives the light and generates an electrical current proportional to the intensity or power of the light. The photodetector can be for short wavelength and long wavelength light sources. This photocurrent is then conditioned and coupled to a transimpedance amplifier. A transimpedance amplifier is an electronic circuit which converts an input signal current into a proportionally scaled output voltage signal. The output of the transimpedance amplifier can be input into a host such as a data processing system, such as a computer. A photoreceiver, comprised of a photodetector and a transimpedance amplifier, can be packaged into a TO can. A TO can is a small, hermetic cylindrical package having a window or a lens on one end to couple the incoming optical data onto a photodetector. The photodetector converts the light to a current which is input to a transimpedance amplifier, and other electronics. On the other end of the TO can are electrical contact pins to transmit electrical data output derived from the optical input and power and ground pins. Because of convention, size and other limitations, the vast majority of TO cans are constrained to, at most, four pins.

An optical power meter is a device which converts light power to a measurable current or voltage that is proportional to the optical input. Optical power detectors can be quite elaborate and expensive. The optical power meter function may be used to monitor the power of the laser generating the optical signal, to measure the loss through the transmission medium, to test the receiving electronics, etc. Typically, to monitor the optical power, the optical fiber is detached from the photodetector associated with the transceiver and the impinging light is attached directly to a separate optical power meter. Then to use the link to receive data again, the fiber is reattached to the optical fiber link. The four-pinned version of the TO can does not have an optical power meter because all four pins are utilized for power, ground, and signaling. Some optical links don't measure the optical power at all, but rather use a "loss of signal" detector which indicates when light is not being received or the photodetector is not working.

There is a need in the optical transmission industry to monitor the optical power received by a link in situ to detect if the laser is losing power which might indicate that the laser or the link may need replacement, or to detect if the link is otherwise faulty.

There is a further need in the industry for a low cost optical power meter function which can be implemented in a TO can or other fiber link package without either introducing more pins or without removing an existing pin function.

Other objects, features, and characteristics of the invention; methods, operation, and functions of the related elements of the structure; combination of parts; and economies of manufacture will become apparent from the following detailed description of the preferred embodiments and accompanying figures, all of which form a part of this specification, wherein like reference numerals designate corresponding parts in the various figures.

SUMMARY OF THE INVENTION

To satisfy the above objects and to provide the industry with a solution to the problems stated above, what is presented herein is an optical receiver comprising a photodetector current source having as output a peak-to-peak current proportional to light impinging on the photodetector, and a peak detector circuit having as input the peak-to-peak current to create a peak voltage that is related to the peak optical power of the impinging light. The peak voltage is in a known relationship to the peak optical power of the impinging light. The optical receiver may further comprise at least one amplifying circuit to generate a peak-to-peak voltage signal from the peak-to-peak current; the peak voltage determined by detecting the peak-to-peak voltage signal; a peak common mode control circuit having as input the peak voltage, the peak common mode control circuit configured as a current sink; and a differential amplifier stage wherein the peak-to-peak voltage signal is imposed on the peak voltage using the current sink.

In a preferred embodiment, the peak detector circuit, the at least one amplifying circuit, the peak common mode control circuit, and the differential amplifier stage are in a transimpedance amplifier connected to the photodetector. The transimpedance amplifier and the photodetector may be packaged in a fiber optic transceiver. The fiber optical transceiver may further comprise a post amplifier connected to the transimpedance amplifier to receive and extract the peak-to-peak voltage signal and generate an optical power signal from the peak voltage, and to interface the peak-to-peak voltage signal and the optical power signal to a host; and a phototransmitter to receive electrical signals from the host and in response thereto generate modulated optical data from transmission. The fiber optical transceiver may be packaged in a TO can.

Another aspect of the invention is a fiber optic transceiver, comprising: a fiber optic interface to receive optical data into the fiber optic and transmit optical data from the fiber optic transceiver; a transmit section comprising a laser and laser driver and safety circuits to generate and transmit optical data from the fiber optic transceiver; a receiver section, further comprising a photodetector to receive the optical data and generate a peak current signal in response to the optical power of the optical data and a transimpedance amplifier having an optical power meter to convert the peak current to a peak voltage signal and a post amplifier to further process the peak voltage signal; and a host interface connected to both the receive and transmit sections to couple electrical signals to the fiber optic transceiver. The post amplifier may extract the optical power from the peak voltage. The peak voltage may be input directly to the post amplifier without affecting the peak voltage signal. Alternatively, the peak voltage may control the peak voltage signal, and the post amplifier may extract the optical power by decoupling the peak voltage signal from the peak voltage. The transimpedance amplifier may further have a voltage signal generating circuit which generates a voltage data signal in response to the optical data; and a current sink which sinks current from the voltage signal generating circuit in response to the common mode voltage so that the voltage data signal is imposed on the common mode voltage.

Another aspect of the invention is an optical power meter, comprising: means to receive an optical signal; means to convert the optical signal to a peak-to-peak current; means to convert the peak-to-peak current to a peak-to-peak voltage; and means to derive a common mode peak control voltage from the peak-to-peak voltage, the common mode peak control voltage in a known relationship with the power of the optical signal. The optical may further comprises a means to drive the peak-to-peak voltage with the common mode control voltage. And yet, the optical power meter of may still further comprise a means to differentiate between the peak-to-peak voltage and the common mode control voltage; and means to determine the optical power from the common mode control voltage.

The invention may still yet be considered a method to measure the optical power of transmitted light, the method comprising the steps of: converting the transmitted light to a peak-to-peak current; converting the current to a voltage signal; detecting the voltage signal to obtain a peak voltage; and determining that the peak voltage is related to the optical power of the transmitted light. The peak voltage is in a known relationship to the optical power of the transmitted light. The method may yet further comprise imposing the voltage signal on the peak voltage.

The invention may still be considered a method of deriving the optical power of transmitted light, comprising: receiving a peak-to-peak voltage signal indicative of data of the transmitted light; decoupling a common mode control voltage from the peak-to-peak voltage signal; and determining the optical power from the common mode control voltage knowing a relationship between the optical power and the common mode control voltage. A linear relationship may exist between the optical power and the common mode control voltage.

DESCRIPTION OF THE DRAWING

Thus, having been summarized, the invention will best be understood by reference to the following description and the Drawing in which.

DETAILED DESCRIPTION OF THE INVENTION

Figure 1:
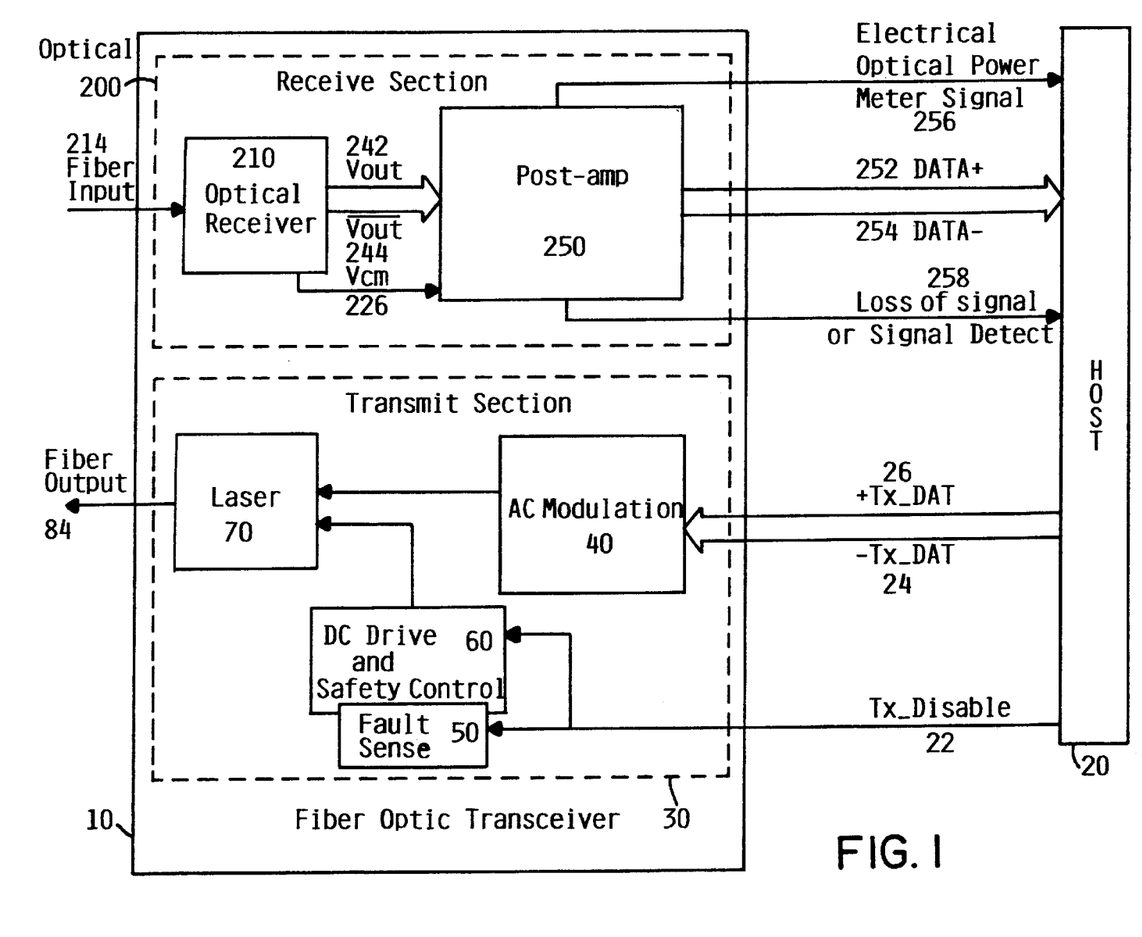
FIG. 1 is a high-level block diagram of an optical transceiver.

FIG. 1 is a simplified block diagram of a fiber optic transceiver 10 having an receive section 200 and a transmit section 30. The fiber optic transceiver 10 preferably provides a high-speed serial or parallel electrical interface for connecting hosts 20, such as computer or device processors, switches, and peripherals through an optical fiber cable. In the Gigabit Ethernet environment, for example, transceiver 10 can be used in such hosts 20 as local area network (LAN) switches or hubs, as well as in interconnecting processors. In storage area networks (SANs) as hosts 20, the transceiver 10 can be used for transmitting data between peripheral devices and processors. Thus, the host 20 may be an electronic switch, a network interface to another system, a computer, a processor with a computer; indeed, any electronic device which may receive data from the transceiver 10. The transmit section 30 of the transceiver 10 is coupled to the host 20 which preferably provides a differential data stream 24 and 26. The modulation 40 of the transceiver 30 is part of the laser driver circuitry which modulates the output optical intensity 84 of a semiconductor laser 70. The DC drive and safety control circuits 60 maintain the laser at a proper power level which may be present and in conjunction with safety circuits and a fault sensor 50, the transmit section 30 will shut off the laser 70 if a fault signal 22 is detected.

The receive section 200 may further comprise an optical receiver 210 which receives the incoming modulated optical signal 214 and converts it to an electrical signal in the optical receiver 210. The electrical signals 242, 244 may then be amplified and converted to a differential serial output data stream 252, 254 and delivered to the host 20. In accordance with an embodiment of the invention, a common mode voltage 226 that is proportional to the peak-to-peak optical power may also be processed by the post amplifier 260 and delivered to the host 20 as an optical power meter signal 256. A signal 258 indicating the detection and loss of a signal and a detection of signal may further be provided to the host 20.

Figure 2:
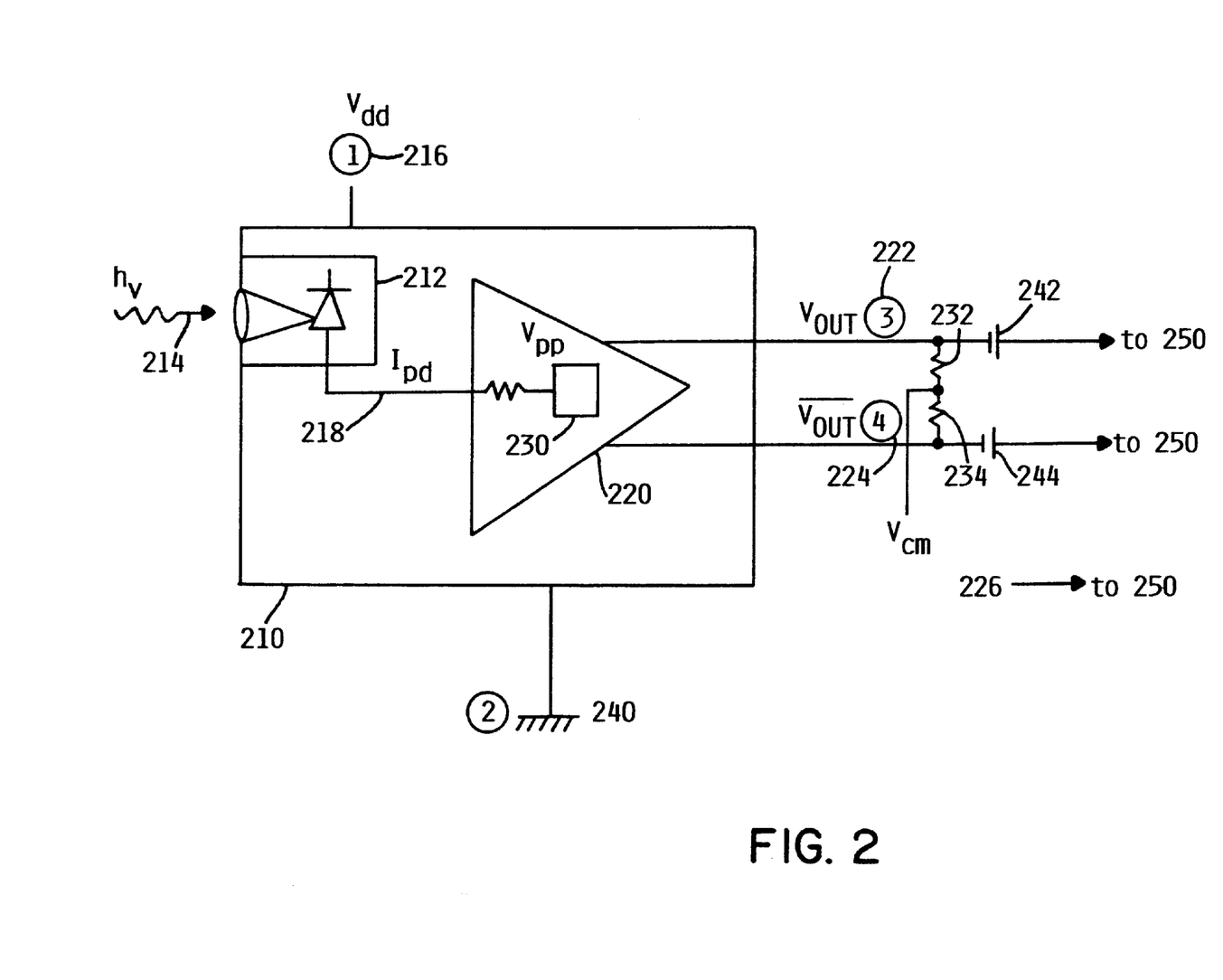
FIG. 2 is a simplified circuit diagram of a optical receiver having a transimpedance amplifier with an in-situ optical power meter. It is suggested that FIG. 2 be printed on the face of the patent.

FIG. 2 is a simplified block diagram of a optical receiver 210. Preferably optical receiver 210 is integrated with the post amplifier 250. Preferably, optical receiver 210 may be packaged together with a post amplifier 250 and a transmit section 30 of a fiber optic transceiver 10 shown in FIG. 1. The optical receiver 210, moreover, may be packaged as a TO can such as a TO46 or a TO56 can and while shown in FIG. 2 as having the four pins 216, 240, 222, and 224 of a TO can, the invention is not limited to the packaging of the TO can or to any packages having a limited number of input/output pins; it is only one application where the transimpedance amplifier with the optical meter function is particularly useful.

Optical receiver 210 comprises at least a photodetector 212 which receives optical input 214 and converts the light to a proportional peak-to-peak photocurrent 218. Typically, the optical input may be light having a longer wavelength on the order of 1.0 to 1.8 micrometers and/or a shorter wavelength on the order of 0.6 to 1.0 micrometers. Those of skill in the art will realize that the wavelength of the light is a detail and that the features of the invention are not limited to any particular wavelength of light or radiation. Furthermore, although the integrated circuits herein usually of silicon CMOS and/or bipolar semiconductor technologies, one of skill in the art will understand that other semiconductor materials may be used for other speeds of data transmission or other wavelengths of light. There is an input power supply voltage 216 and a ground return provided 240 to the optical receiver 210. The photocurrent 218 is input to a transimpedance amplifier 220 where it is converted to a peak-to-peak voltage that is conditioned and amplified. The transimpedance amplifier 220 then provides three outputs: a true and complement of the output signal voltage 222, 224, respectively, and a common mode voltage 226 derived from signal 222 and 224 that is proportional to the peak received optical power. An optical power meter circuit 230 generates and controls the common mode voltage 226 as a function of the input peak-to-peak current 218 in accordance with principles of the invention. The invention realizes that the common mode voltage 226 is in a known relationship to the optical power input, preferably directly proportional but other relationships may be determined by the circuit implementation. The common mode voltage 226 is obtained by reading the voltage between two resistors 242, 244 placed across the output 222, 224 before the two capacitors 232, 234 of the transimpedance amplifier 220. Processing and signal conditioning of the post amplifier 250 can extract the common mode voltage 226 from the signals 222, 224 to obtain the power of the optical input.

Figure 3:
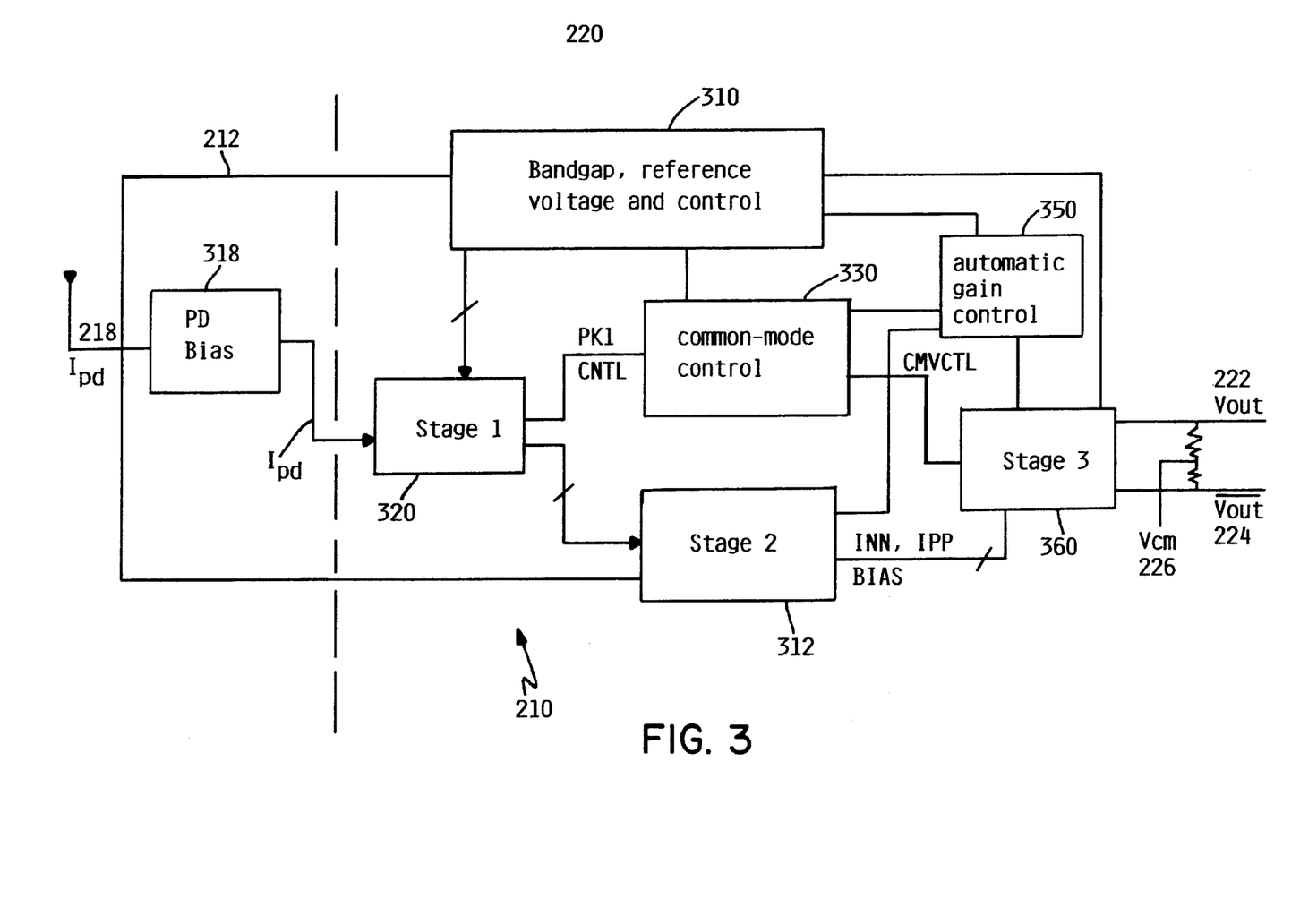
FIG. 3 is a block diagram of the electronic functions of a transimpedance amplifier having an in-situ optical power meter.

FIG. 3 is a simplified block diagram of functions performed by the electronic circuits of the photodetector 212 and the transimpedance amplifier 220. These components include a PD Bias 318, a stage1 amplifier 320, bandgap and reference control circuits 310, a common mode control circuit 330, a stage2 amplifier 312, an automatic gain control circuit 350, and a stage3 amplifier circuit 360. The output of the stage3 amplifier circuit 360 is preferably AC coupled to a post amplifier 250 of a fiber optic transceiver 30 to boost the voltage levels to digital voltage levels satisfying the host system interface for signals 22, 24, 26, 252, 254, 256, 258 of FIG. 1. Some circuits of the photodetector and transimpedance amplifiers shown in FIG. 2 are not be described herein to the extent that they are not involved with the power meter function of the invention. For instance, the circuits of PD Bias 318 properly bias and provide a cathode voltage for the photodetector 212. In addition, the PD Bias 318 couples the signal photocurrent 218 to stage1 320 of the transimpedance amplifier 220. The circuits within stage2 312 of the transimpedance amplifier 220 provide, inter alia, a differential amplification stage and control the bandwidth of the signal. Block 310 called the bandgap reference voltage and control provides bandgap voltage references, compensates for the inherent semiconductor resistance, nulls out undesirable effects, provides bias currents for various stages, etc. Where the transimpedance amplifier 220 is linear over the full optical power range, there may be an automatic gain control 350 which controls the peak-to-peak swing of the output voltages 222 and 224. The circuits participating in the optical power meter function 230 of the transimpedance amplifier comprise stage1 320, the common mode control 330, and stage3 360. Each of these will be discussed in more detail.

Figure 4:
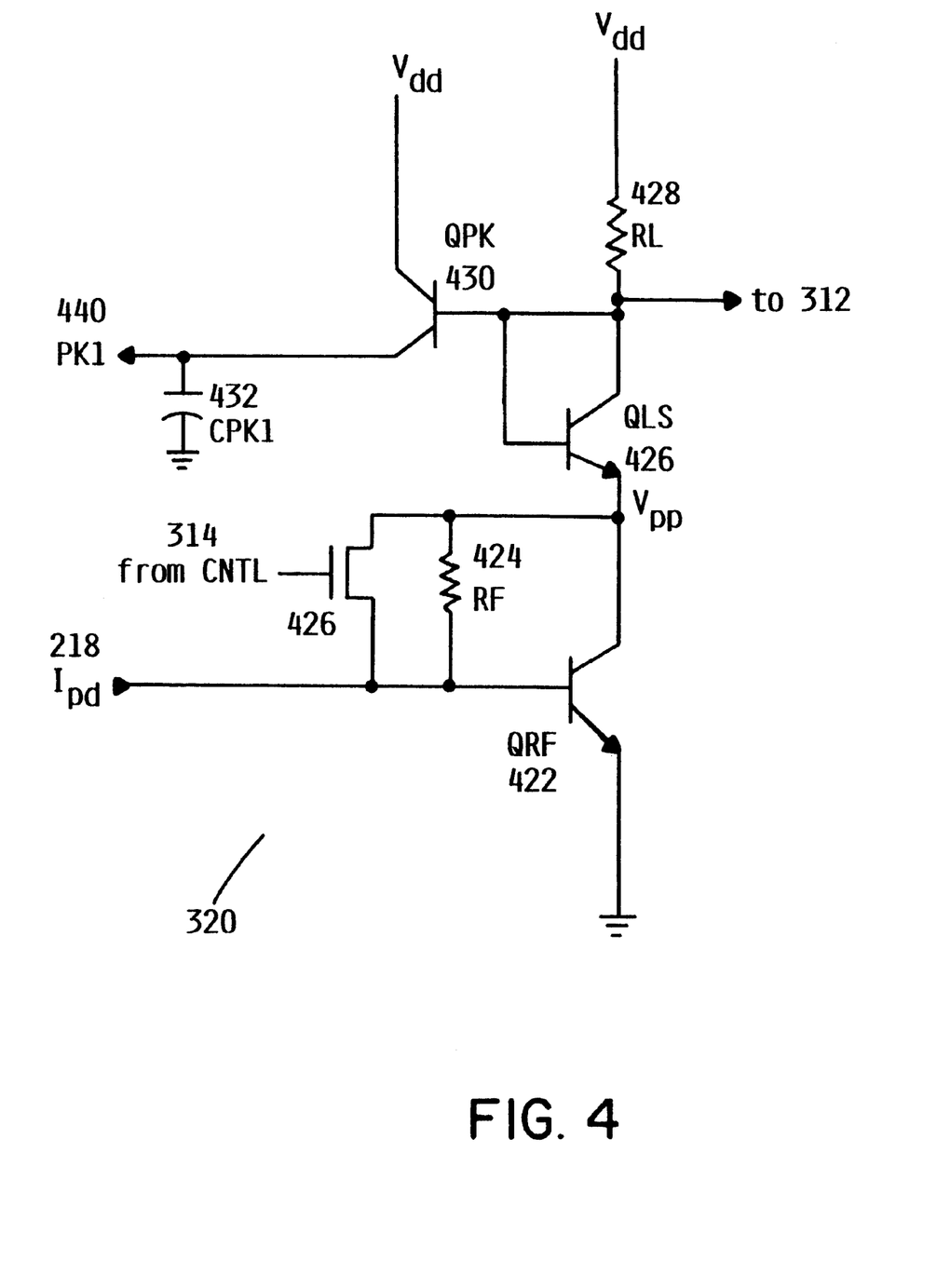
FIG. 4 is a simplified circuit diagram of the first amplification stage of a transimpedance amplifier of the optical receiver having an in-situ optical power meter.

With respect to FIG. 4, therein is a simplified circuit diagram of the components of stage1 320 of the transimpedance amplifier 220 in a optical receiver 210 pertinent to the optical power meter. Stage1 320 may comprise many more circuit elements not shown in FIG. 4. The coupled peak-to-peak photocurrent signal 218 from the PD Bias circuit 318 is input to stage1 320 at a resistor RF 424 and a first transistor stage QRF 422 which convert the peak-to-peak photocurrent 218 to a peak-to-peak voltage. Feedback is provided to the collector of the transistor QRF 422 by resistor RF 424. Preferably transistors QRF 422, QLS 426, and QPK 430 are npn bipolar transistors to achieve high bandwidth. Transistor QLS 426 is configured as a diode to stack the peak-to-peak voltage through resistor RL 428 to minimize the resistance, compensate for the Miller effect through the stage1 320, and hold off the voltage from Vdd. The output of QLS 426 is provided to stage2 312 of the transimpedance amplifier 220 and to a second transistor QPK 430 which is in an emitter-follower configuration to follow the peak voltage output of transistor QLS 426. The peak voltage is obtained using transistor QPK 430 in conjunction with a large capacitor CPK1 which creates a RC time constant to smooth the peak voltage obtained from the transistor QRF 422. This smoothed output voltage PK1 440 is input to the common mode control 330 and becomes the common mode voltage which steers the outputs of the true 222 and complementary 224 signals.

One particularly beneficial aspect of the invention is the use of the peak voltage rather than the average voltage. A photodetector in a transceiver may be receiving ambient light and generate a signal and thus the transimpedance amplifier would generate an average voltage in response thereto. Distinguishing between an optical signal having high amplitude and one with low amplitude and one not having an optical signal at all is difficult, if not impossible, using an average voltage of a signal. In other words, it does not matter if the signal strength is ±1.8 units such as micro-, milli-, volts or ±0.8 units, the average is still the same. But if the peak voltage changes from 0.8 units to 1.8 units over time, that difference can be detected as the peak voltage generated in stage1 320 of the transimpedance amplifier 220.

Note that in alternative packaging of a transceiver 10 where there is no limitation to the number of output pins, this peak voltage PK1 440 may be tapped directly for further processing by the post amplifier 250 to yield the optical power of the impinging light. If, however, there are restrictions on the number of pins output from the optical receiver 210, then the peak voltage PK1 440 can be used to steer the signal voltage as described below.

Figure 5:
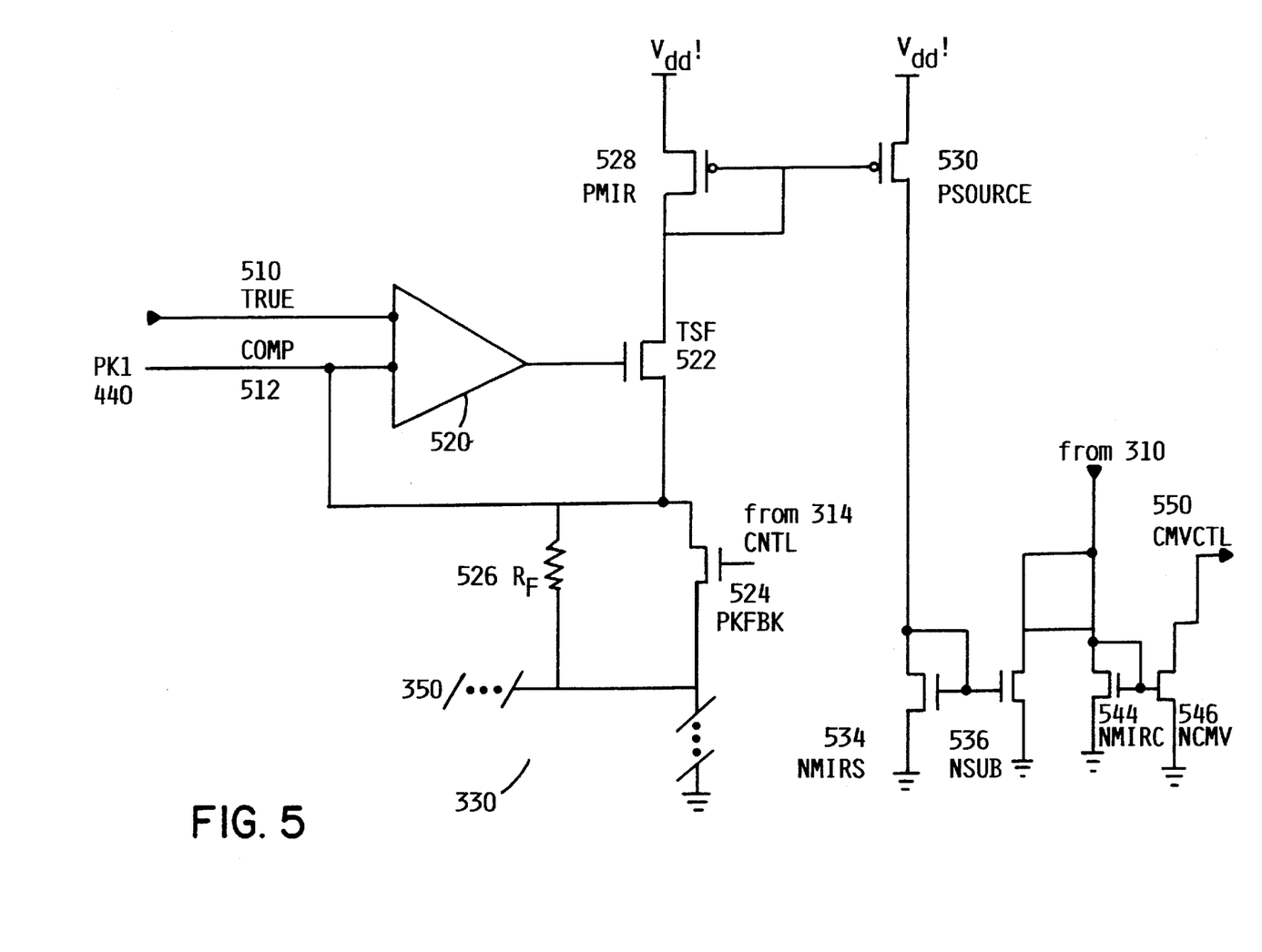
FIG. 5 is a simplified circuit diagram of the common mode control of a transimpedance amplifier of the optical receiver having an in-situ optical power meter.

FIG. 5 is a simplified circuit diagram of the pertinent portions of the common mode control 330. The smoothed PK1 440 voltage output from stage1 320 is input to an operational amplifier 520 of the common mode control 330. The output of the operational amplifier 520 feedbacks onto itself as the complement COMP 512 of the input signal relabeled TRUE 510. The output is also input to the gate of a nfet TSF 522 to remove temperature variability. The signal then is received in parallel by a dropping resistor RF 526 and another nfet PKFBK 524 whose gate is controlled by voltage CNTL from the automatic gain control circuit 314. Transistor PKFBK 524 behaves as a variable resistor. The net result is a current from transistor TSF 522 which develops a voltage across the resistor RF 526 which then goes through a first current mirror comprising two pfets PMIR 528 and PSOURCE 530. The mirrored current from pfet PSOURCE 530 is mirrored again through two nfets NSUB 534 and NSUB 536 along with a voltage signal from 310 which compensates for bandgap and the inherent semiconductor resistance. The combined current gets mirrored a third time through nfets NMIRC 544 and NCMV 546 which behaves as a current sink. The use of the current sink of the common mode control is what the common mode peak voltage uses to steer the output signals 222, 224 as will be discussed in FIG. 6. When the input signal PK1 440 is at a maximum, the output signal CMVCTL 550 sinks a minimum current, e.g., one milliamp, but when input signal PK1 440 decreases, CMVCTL 550 sinks current from stage3 360 which is the last stage of the transimpedance amplifier 220.

Figure 6:
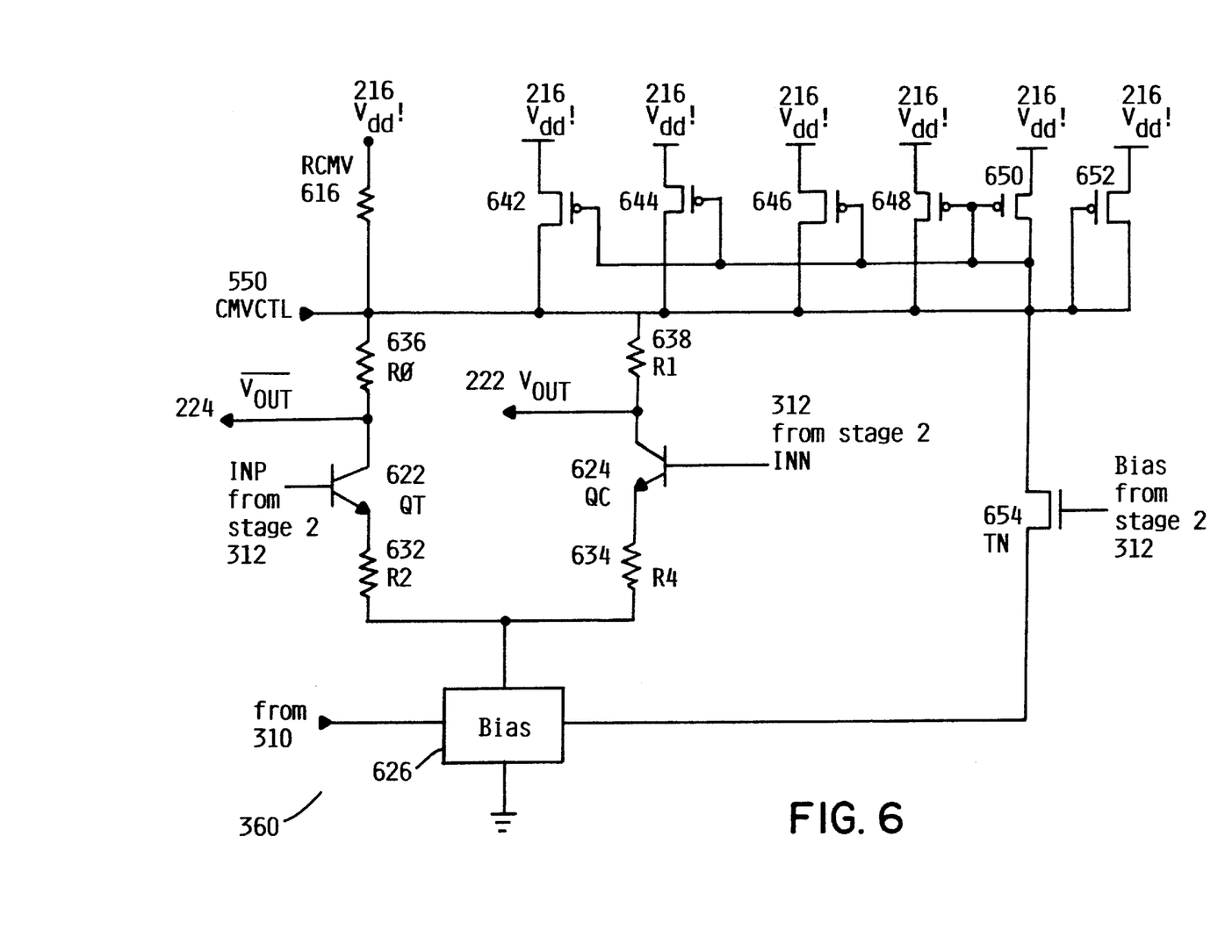
FIG. 6 is a simplified circuit diagram of a differential amplifier stage of a transimpedance amplifier of the optical receiver having an in-situ optical power meter.

The signal CMVCTL 550 from the common mode control 330 is input to stage3 360. FIG. 6 is a simplified circuit diagram of the pertinent portions of stage3 360 of the transimpedance amplifier 220 in the optical receiver 210. Stage3 360 has some features of a classical differential amplifying stage with two npn bipolar transistors QT 622 and QC 624 facing each other with their emitters tied together through a respective resistor R2 632 and R4 634 to a tail bias current source 626. In accordance with one implementation of the invention, however, the collectors are also tied together through respective resistors R0 636 and R1 638 to a bank of pfets and a resistor RCMV 616 to Vdd 216. A nfet TN 654 whose gate is controlled by a bias from stage2 312 controls how much current passes through the pfets 642-652. When there is no photocurrent 218, the signal CMVCTL 550 is sinking a large amount of current and the rest of the current goes through the differential amplifier of transistors 622, 624 and their respective resistors 632, 634, etc. The signal CMVCTL 550 responds to a higher peak voltage PK1 440 by sinking less current from the differential amplifier biasing circuits of stage3 360. By sinking or sourcing (as another embodiment) a greater or lesser current, the output voltages 222 and 224 are affected accordingly.

The invention as described herein takes advantage of a wide range of optical power to the receiver. The optical power meter circuit steers the common mode peak voltage levels as seen at the peak voltage output signal pins. The peak voltage output signals simply ride a dynamic common mode voltage that is proportional to the peak optical power. This approach for creating a continuously varying common mode voltage as an indicator of optical power is unique. The approach used by the invention takes advantage of linear peak signal detection to linearly modify the common mode voltage. The common mode voltage can be processed from the AC signal output by the optical receiver and can be post processed before being presented to the host computer. Several unique features of the invention herein is that first it overcomes the lack of signal pins by using the existing AC output pins; and second it has a wide optical dynamic range that exceeds existing designs that have the extra pins for the optical power monitor. Furthermore, the optical power meter method is a peak method which provides more detail concerning the presence of an AC modulated optical signal. An averaging type of optical power can only ascertain the DC component of a signal.

The invention is particularly applicable as a receiver front end in serial or parallel fiber optical links. Specific systems which would benefit from the invention are fiber optic applications in Gigabit Ethernet, Infiniband, OIF, SONET, and Fibre Channel for multigigabit data rates. The optical power meter function is fabricated using semiconductor technologies. One of skill in the art will realize that for different applications, more or fewer transistors and/or circuit elements of different specifications can be used. It is preferable to have a bank of pfets 642–652 as shown in FIG. 6 rather than one large pfet because of processing considerations. Of course, the values of the pfets/nfets/bipolars can change according to the design considerations. Thus, which has been achieved is an in-situ optical power meter in a transimpedance amplifier that is very accurate, highly sensitive, and has a dynamic optical range.

While the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

What is claimed is:

1. A method of deriving the optical power of transmitted light, comprising:

(a) receiving a peak-to-peak voltage signal indicative of data of the transmitted light;

(b) decoupling a common mode control voltage from the peak-to-peak voltage signal;

(c) determining the optical power from the common mode control voltage knowing a relationship between the optical power and the common mode control voltage.

2. The method of claim 1, wherein a linear relationship exists between the optical power and the common mode control voltage.

3. An optical receiver, comprising:

(a) a photodetector current source having as output a peak-to-peak current proportional to light impinging on the photodetector;

(b) at least one amplifying circuit to generate a peak-to-peak voltage signal from the peak-to-peak current;

(c) a peak detector circuit having as input the peak-to-peak current to detect the peak-to-peak voltage and generate a peak voltage that is related to the peak optical power of the impinging light.

(d) a peak common mode control circuit having as input the peak voltage, the peak common mode control circuit configured as a current sink; and (e) a differential amplifier stage wherein the peak-to-peak voltage signal is imposed on the peak voltage using the current sink.

4. The optical receiver of claim 3, wherein the peak detector circuit, the at least one amplifying circuit, the peak common mode control circuit, and the differential amplifier stage are in a transimpedance amplifier connected to the photodetector.

5. The optical receiver of claim 4, wherein the transimpedance amplifier and the photodetector are packaged in a fiber optic transceiver.

6. The optical receiver of claim 5, further comprising:

(a) a post amplifier connected to the transimpedance amplifier to receive and extract the peak-to-peak voltage signal and generate an optical power signal from the peak voltage, and to interface the peak-to-peak voltage signal and the optical power signal to a host; and (b) a phototransmitter to receive electrical signals from the host and in response thereto generate modulated optical data from transmission.

7. The optical receiver of claim 6 packaged in a TO can.

8. A fiber optic transceiver, comprising:

(a) a fiber optic interface to receive optical data into the fiber optic and transmit optical data from the fiber optic transceiver;

(b) a transmit section comprising a laser and laser driver and safety circuits to generate and transmit optical data from the fiber optic transceiver;

(c) a receiver section, further comprising:
   (i) a photodetector to receive the optical data and generate a peak current signal in response to the optical power of the optical data;
   (ii) a transimpedance amplifier having an optical power meter to convert the peak current to a peak voltage signal; and
   (iii) a post amplifier to further process the peak voltage signal;

(d) a host interface connected to both the receive and transmit sections to couple electrical signals to the fiber optic transceiver.

9. The fiber optic transceiver of claim 8, wherein the post amplifier extracts the optical power from the peak voltage.

10. The fiber optic transceiver of claim 9, wherein the peak voltage is input directly to the post amplifier without affecting the peak voltage signal.

11. The fiber optic transceiver of claim 9, wherein the peak voltage controls the peak voltage signal, and the post amplifier extracts the optical power by decoupling the peak voltage signal from the peak voltage.

12. The fiber optic transceiver of claim 11, wherein the transimpedance amplifier further comprises:
  (a) a voltage signal generating circuit which generates a voltage data signal in response to the optical data; and
  (b) a current sink which sinks current from the voltage signal generating circuit in response to the common mode voltage so that the voltage data signal is imposed on the common mode voltage.

13. An optical power meter, comprising:
  (a) means to receive an optical signal;
  (b) means to convert the optical signal to a peak-to-peak current;
  (c) means to convert the peak-to-peak current to a peak-to-peak voltage; and
  (d) means to derive a common mode peak control voltage from the peak-to-peak voltage, the common mode peak control voltage in a known relationship with the power of the optical signal.

14. The optical power meter of claim 13, further comprising:
  (a) means to drive the peak-to-peak voltage with the common mode control voltage.

15. The optical power meter of claim 14, further comprising:
  (a) means to differentiate between the peak-to-peak voltage and the common mode control voltage; and
  (b) means to determine the optical power from the common mode control voltage.

16. A method to measure the optical power of transmitted light, the method comprising the steps of:
  (a) converting the transmitted light to a peak-to-peak current;
  (b) converting the current to a voltage signal;
  (c) detecting the voltage signal to obtain a peak voltage; and
  (d) determining that the peak voltage is related to the optical power of the transmitted light.

17. The method of claim 16, wherein the peak voltage is in a known relationship to the optical power of the transmitted light.

18. The method of claim 17, further comprising:
  (a) imposing the voltage signal on the peak voltage.

19. An optical receiver, comprising:
  (a) a photodetector current source having as output a peak-to-peak current proportional to light impinging on the photodetector; and
  (b) a peak detector circuit having as input the peak-to-peak current to create a peak voltage riding a dynamic common mode voltage related to the optical power of the impinging light.

* * * * *